United States Patent [19]

Reithel et al.

[11] Patent Number: 4,943,514

[45] Date of Patent: Jul. 24, 1990

[54] NEGATIVE-WORKING DYEABLE PHOTORESIST

[75] Inventors: Raymond F. Reithel; Richard C. Sutton, both of Rochester, N.Y.

[73] Assignee: Eastman Kodak Company, Rochester, N.Y.

[21] Appl. No.: 211,810

[22] Filed: Jun. 24, 1988

[51] Int. Cl.$^5$ .............................................. G03C 1/66
[52] U.S. Cl. ..................................... 430/270; 430/213; 430/238; 430/289; 430/941; 430/322
[58] Field of Search ............... 430/941, 289, 238, 213, 430/270, 322

[56] References Cited

U.S. PATENT DOCUMENTS 4,619,883 10/1986 Aono et al. ..................... 430/213
4,647,519 3/1987 Speigel ............................ 430/289

OTHER PUBLICATIONS

Research Disclosure 17643, Dec. 1978, p. 26.

*Primary Examiner*—Paul R. Michl
*Assistant Examiner*—Thorl Chea
*Attorney, Agent, or Firm*—William J. Davis

[57] ABSTRACT

A negative-working dyeable photoresist composition comprising in admixture
(a) a poly(vinyl alcohol) binder,
(b) a radiation-sensitive dichromate, and
(c) a polymeric mordant comprising recurring units derived from a quaternized N-vinylimidazole is useful in the preparation of continuous tone dyed imaging elements.

4 Claims, No Drawings

NEGATIVE-WORKING DYEABLE PHOTORESIST

CROSS REFERENCE TO RELATED APPLICATION

Reference is hereby made to commonly assigned copending U.S. Pat. application Ser. No. 212,381 entitled SOLID STATE COLOR IMAGING SENSOR HAVING A COLOR FILTER ARRAY filed in the names of R. F. Reithel and R. C. Sutton concurrently herewith.

FIELD OF THE INVENTION

This invention relates to dyeable negative working photoresist compositions particularly useful in the preparation of continuous tone dyed imaging elements.

BACKGROUND OF THE INVENTION

Negative working photoresists containing photoinsolubilizable polymers are known to be useful in a variety of applications. Such compositions can be coated on a support and imagewise exposed so as to crosslink, harden or otherwise render insoluble the exposed coating. A wash or developing step removes the unexposed coating. Such compositions are sometimes referred to as being of the "wash off" type.

Photohardenable dyeable "wash off" compositions are known. One dyeable wash off composition known in the art is dichromated gelatin. In this approach, gelatin is employed in combination with a dichromate salt employed as the radiation responsive hardening agent. Gelatin is known to exhibit some capacity for mordanting dyes.

Another dyeable wash off composition is described in U.S. Pat. No. 4,220,700. In this approach, a diazo resin can be mixed with certain mordants to produce photohardenable imaging compositions and elements useful in the preparation of continuous tone dye images.

Problems exist with both diazo resin/mordant and dichromated gelatin resist materials. For example, dichromated gelatin layers exhibit dye saturation levels which vary widely with PH, temperature and the amount of exposure. On the other hand, diazo resin/mordant resists exhibit less variable dye saturation levels and better resolution and solution keeping properties compared to dichromated gelatin. However, the diazo resin/mordant resist is inherently slow and tends to discolor upon exposure to heat or light in the presence of oxygen. Moreover, both of these dyeable resist materials are highly colored (yellow brown) and absorb blue light, which is particularly disadvantageous in some applications, for example, in the manufacture of color filter elements for some solid state image sensors.

SUMMARY OF INVENTION

We have discovered a single phase negative working dyeable photoresist composition which is less colored and absorbs less blue light than the diazo resin/mordant and dichromated gelatin resist materials discussed above. In accordance with this invention, there is provided a resist composition comprising, in admixture, a poly(vinyl alcohol) binder, a radiation sensitive dichromate, and a polymeric mordant derived from a quaternized N-vinylimidazole.

The dyeable resist of this invention exhibits better speed than diazo resin/mordant and dichromated gelatin materials, is water soluble, exhibits good rheological properties, fine resolution, sharp pattern profiles, low scumming, uniform dye uptake and good dye density to layer thickness ratios. Additionally, the poly(vinyl alcohol) acts as a built in oxygen barrier for the dyes to increase their light and thermal stability. The resist is particularly useful in the preparation of continuous tone dyed imaging elements and color filter elements.

In accordance with another aspect of the invention, there is provided a method of producing a continuous tone dyed negative working image in a light sensitive resist composition comprising the steps of (a) imagewise exposing to activating radiation the above described negative working dyeable resist composition, (b) developing the exposed composition so that only the exposed areas remain, and (c) contacting the developed resist with at least one dye.

DESCRIPTION OF THE PREFERRED EMBODIMENT

The resist of this invention will be discussed primarily in regard to its utility in the preparation of continuous tone dyed imaging elements, although the invention is not limited to continuous tone reproductions. The invention is useful in a variety of fields wherein continuous tone images are employed. For example, continuous tone imaging is useful in pre press color proofing elements, in graphic arts print film, in microfiche print film, as an intermediate or release print for video disc applications, as an intermediate film for UV contact exposure in liquid crystal displays, in color wheels and the like. In the invention described and claimed in U.S. patent application Ser. No. 212,381, cited above, the resist material of this invention is used in a solid state color imaging sensor having a color filter array.

The poly(vinyl alcohol), also referred to hereinafter as PVA, functions as a binder for the dyeable photoresist composition of this invention. Poly(vinyl alcohols) having a number average molecular weight from 14,000 to 160,000 have been used with particular advantage in the practice of this invention. Preferred poly(vinyl alcohols) have a molecular weight of about 40,000 to 100,000. The reason for this is that the PVA/mordant mixture viscosity advantageously provides a dried resist layer thickness having good dye density when dyed. Preferred poly(vinyl alcohols) are hydrolyzed, most preferably from 88% up to 100%. Such hydrolyzed poly(vinyl alcohols) provide enhanced solubility in the aqueous coating composition.

The poly(vinyl alcohol) is employed in combination with a radiation-sensitive dichromate salt which functions as a hardening agent. The dichromate salt upon exposure to activating radiation produces a negative-working image after development of the resist. The dichromate salt is, for example, potassium, sodium or ammonium dichromate. Ammonium dichromate is particularly preferred for use herein. The dichromate sensitizer can be used conveniently in amounts of 0.001–0.10, preferably 0.005–0.05 weight percent based on the weight of the poly(vinyl alcohol) present in the resist composition. The dichromate advantageously forms virtually no unacceptable colored products with PVA during the photocrosslinking reaction and any excess, unused dichromate readily washes out of the resist layer leaving it essentially colorless throughout the visible spectrum. However, the PVA resist alone does not dye adequately with anionic dyes or with acid dyes at low pH.

Polymeric mordants useful in the resist composition of this invention are derived from a quaternized N vinylimidazole. We have unexpectedly found that such mordants are compatible with the dichromate sensitized poly(vinyl alcohol) and provide a single phase resist composition.

Particularly useful polymeric mordants contain recurring units:

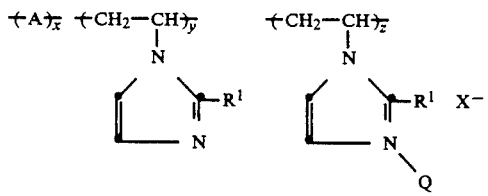

wherein:
A is a unit derived from an ethylenically unsaturated monomer;
each $R^1$ is independently H or methyl;
Q is alkyl or aryl;
$X^-$ is an acid anion;
x is 0 to 65 mole percent;
y is 0 to 95 mole percent; and
z is 5 to 50 mole percent.

In the above Formula, Q represents an alkyl or substituted alkyl group, the alkyl portion of which preferably contains from 1 to 12 carbon atoms, cycloalkyl, aryl or substituted aryl group, the aryl portion of which preferably contains from 6 to about carbon atoms, such as methyl, ethyl, butyl, hydroxyethyl, hydroxypropyl, dihydroxypropyl, cyclohexyl, phenyl, xylyl, tolyl, benzyl, diphenylmethyl, methoxybenzyl, p-methoxyphenyl, 3,4-dimethoxy-phenyl, 3,4-dimethoxybenzyl, 3,4-methylenedioxy-benzyl, 3,4-ethylenedioxyphenyl, 2(2,4,5-trimethoxy-phenoxy) ethyl, 3(3,4-dimethoxyphenoxy) 2-hydroxyyl-propyl, 3(2,4,5-trimethoxyphenoxy) 2-hydroxypropyl, 3,5-diethoxyphenyl, p-chlorobenzyl, 3,4-dibromo-benzyl, 3(4-methoxyphenoxy) 2-hydroxypropyl, 3,4-dimethoxyphenyl)propyl, 2-(3,4-methylenedioxy-phenoxy) ethyl, or 2(3,4-dimethoxyphenoxy)ethyl $X^-$ is any acid anion such as chloride, bromide, methanesulfonate, propionate p-toluenesulfonate, methylsulfate, nitrate, acetate, sulfate and the like.

The polymeric mordant used in this invention comprises from 0 to about 65 mole percent of units derived from an ethylenically unsaturated monomer. In preferred embodiments the polymer comprises 0 to about 60, more preferably 40–60 mole percent of the ethylenically unsaturated monomer.

Any ethylenically unsaturated monomer which is addition polymerizable is useful. Examples of such monomers include acrylic esters, such as methyl methacrylate, butyl acrylate, butyl methacrylate, ethyl acrylate, phenoxyethyl acrylate, and cyclohexyl acrylate; vinyl esters such as vinyl acetate, amides, such as acrylamide, diacetone acrylamide, N-methyl acrylamide and methylacrylamide; nitriles, such as acrylonitrile and vinylphenylacetonitrile; ketones, such as methyl vinyl ketone, ethyl vinyl ketone, and p-vinylacetophenone; halides, such as vinyl chloride, vinylidene chloride and vinylbenzyl chloride, ethers, such as methyl vinyl ether, ethyl vinyl ether, and vinylbenzyl methyl ether; simple heterocyclic monomers such as vinylpyridine and vinylpyrrolidone; olefins such as ethylene, propylene, butylene and styrene as well as substituted styrenes; diolefins such as butadiene and 2,3-dimethylbutadiene and the like and other vinyl monomers within the knowledge and skill of an ordinary worker in the art. Styrene is employed to provide A in a particularly preferred embodiment of the invention.

In particularly preferred embodiments of the invention, each $R^1$ is hydrogen, A represents a styrene moiety, z is 10 to 25 mole percent and Q represents benzyl or hydroxyethyl.

Not all mordants are capable of functioning effectively with the dichromate sensitized poly(vinyl alcohol) binder. For example, some mordants, such as quaternary ammonium mordants, are incompatible with the sensitized binder, e.g., they do not form a single phase, because they precipitate in the presence of small amounts of dichromate, preventing the composition from being coated.

The above-described polymeric mordants useful in the practice of this invention can be prepared by known polymerization techniques which can be carried out with an initiator such as potassium persulfate decomposition initiator, a potassium persulfate-sodium bisulfite redox initiator system, peroxides, e.g. benzoyl peroxide, azo catalysts, e.g. 2,2'-azobis(2-methylpropionitrile), and the like, preferably in a concentration of 0.5 to about 1.5 percent, based on total monomer, and at any temperature and pressure, but preferably at 60° C. to 120° C. and approximately at atmospheric pressure. The polymerization is preferably carried out in a solvent such as N,N-dimethylformamide, 1-methyl-2-pyrrolidinone and the like. A particularly preferred method for preparing the polymeric mordant is taught in Example 2 of U.S. Pat. No. 4,450,224.

The relative amounts of poly(vinyl alcohol) and mordant depend on the molecular weight of the PVA and the particular mordant selected, the particular dye selected to be imbibed, and other factors. PVA/mordant ratios of 1/1 up to 3/1 have been successfully employed. A preferred ratio is about 2/1. The reason for this is that the resulting mixture viscosity provides good photospeed and resist thickness latitude and good dye density. Lesser relative amounts of mordant produce lower dye density but higher resolution, whereas greater relative amounts of mordant produce higher dye density but lower resolution.

As noted, a particularly advantageous feature of the resist material of this invention is its ability to provide fine resolution, sharp pattern profiles and low scumming. These properties relate partly to the non-swelling character of the resist. The swelling of the photo insolubilized resist depends in part on the mordant quaternizing species. For example, mordants quaternized with benzyl chloride were found to swell less than those quaternized with chloroethanol. On the other hand, the adhesion of the former to the substrate was not as good. Swelling also depends in part on the monomer ratio. Some swelling at low amounts of A and at amounts of the quaternized vinylimidazole over 25 mole % has been observed. Excellent results have been observed for amounts of the quaternized vinyl imidazole between 10 and 20 mole % and for amounts of A between about 40 and 60 mole %.

The dyeable resist composition of the invention can optionally include a variety of conventional addenda, for example surfactants and/or stabilizers, examples of which are readily obtainable from the literature.

The dyeable resist composition of the invention is preferably applied to a suitable support and contact or projection-exposed imagewise to activating radiation. As used herein "support" includes semiconductor substrates including, if present, various levels of, for example, oxides, metallization, doped semiconductor material, insulators, and/or planarizing layers. Useful supports include sheets and foils of such metals as aluminum, copper, magnesium, zinc, etc.; glass and glass coated with such metals as chromium, chromium alloys, steel, silver, gold, platinum, etc.; synthetic polymeric materials such as poly(alkyl methacrylates), e.g., poly(methyl methacrylate), polyester film base, e.g., poly(ethylene terephthalate), poly(vinyl acetals), polyamides, e.g., nylon, cellulose ester film base, e.g., cellulose nitrate, cellulose acetate, cellulose acetate propionate and cellulose acetate butyrate. For the manufacture of integrated circuit devices, silicon wafers, as well as silicon nitride and chromium coated glass plate supports, are particularly useful. Depending upon the support selected, adhesion aids are optionally applied first as a sub-coating.

Any conventional method can be used to apply the composition to the support. The preferred method is application of a thin coating using an appropriate solvent. Useful coating techniques include spin coating, spray coating, curtain coating, and roll coating. The solvent used to prepare the resist composition for coating can be selected from any conventional coating solvent. Useful solvents include water, and water miscible organic solvents such as alcohols, esters, ethers, and ketones. A particularly preferred solvent is water. Preferred final thicknesses of the resist vary, depending upon the final use. Examples of preferred thicknesses range from between about 0.1μ to about 10μ.

Any form of exposure to which the resist is responsive can be used. Because the dichromate sensitized PVA is primarily responsive to UV light, the light source preferably is rich in UV. Conventional light sources of such character are readily available, and can be used. The preferred exposure technique depends of course upon the end result desired.

While any dye which can be deposited uniformly in the dyeable resist is useful in the practice of this invention, preferred dyes are anionic or zwitterionic dyes, which are therefore capable of being immobilized by the quaternized mordant. Any such dye can be used to form a visual image in the resist by imbibition. The dye chosen will, of course, depend upon the desired color and therefore upon the desired end use. Representative useful dyes are disclosed in U.S. Pat. No. 4,220,700, and in published European Patent application 249,991. The resist can be dyed with a combination of dyes.

The preferred ionic dyes can be readily dissolved in a polar solvent for imbibition into the resist layer. Aqueous dye solutions can be employed. However, any other convenient polar solvent compatible with the resist layer can be employed alone or in combination with water, if desired, such as, for example, methanol, ethanol, 4-butyrolactone, dimethyl sulfoxide, dioxane, ethanolamine, or mixtures thereof. Preferred solvents are those which can be imbibed into the resist layer. Typically a small amount of a surfactant is also added to the dye solution to facilitate wetting of the resist layer.

Exemplary preferred yellow, magenta and cyan dyes are listed in Table I.

TABLE I

CD-1
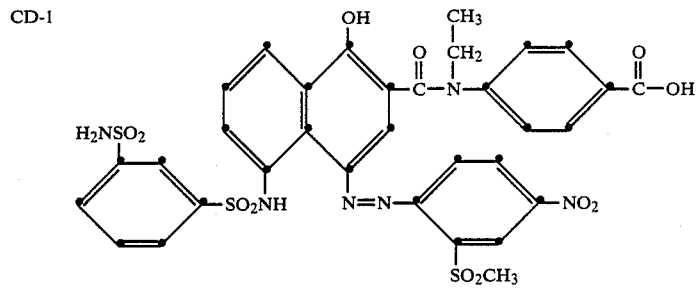

CD-2 Copper phthalocyanine tetrasulfonic acid, tetrasodium salt

MD-1
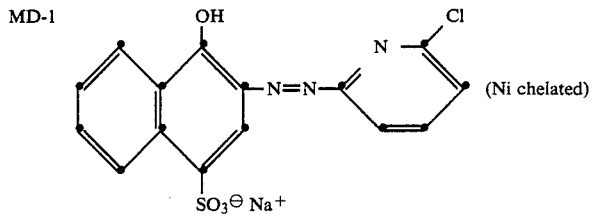
(Ni chelated)

TABLE I-continued

MD-2
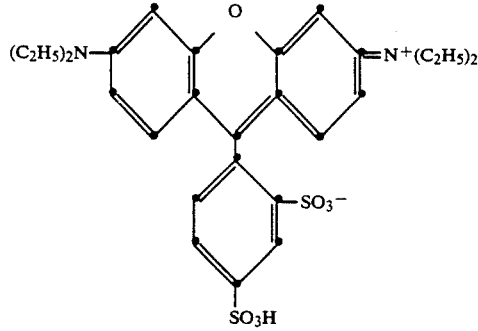

YD-1
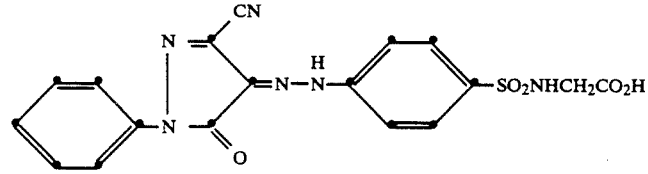

YD-2
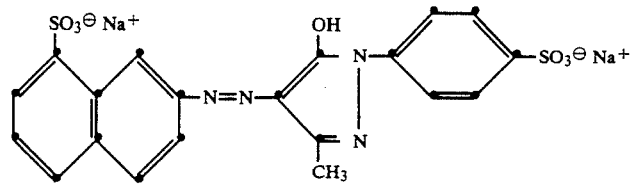

EXAMPLES

The following preparations and examples further illustrate the invention:

Preparations

| Preparation 1: PVA/mordant formulation 1 (2/1) | | |
|---|---|---|
| 10% | Poly(vinyl alcohol) Elvanol 71/30 G in deionized water | 100.0 g |
| 20% | $(NH_4)_2CrO_7$ in deionized water, pH adjusted to 7.0 with 5 g of a 28% solution of $NH_4OH$ in water | 1 ml |
| 10% | Mordant of Formula I in deionized water wherein A = styrene, R' = H, x = 50, y = 38, z = 12 Quaternized with chloroethanol | 50.0 g |

The pH of the formulation was adjusted to 6.0 with 6N HCl. The dichromate was added to the PVA solution first and then the mordant was added slowly with stirring to avoid precipitation of the mordant due to a concentration effect.

| Preparation 2: Cyan Dye Solution | |
|---|---|
| CD-2 | 1.0 g |
| Surfactant A (a 50% aqueous solution of of nonylphenoxypolyglycidol) | 0.4 g |
| 4-Butyrolactone | 50 ml |
| pH 4 buffer | 150 ml |
| Preparation 3: Magenta Dye Solution 1 | |
| MD-1 | 0.125 g |
| Surfactant A | 0.4 g |
| Deionized water | 200 ml |
| pH adjusted to 3 with HCl | |
| Preparation 4: Magenta Dye Solution 2 | |
| MD-2 | 0.035 g |
| Surfactant A | 0.4 g |
| pH 4 buffer | 200 ml |
| Preparation 5: Yellow Dye Solution 1 | |
| YD-1 | 0.5 g |
| Surfactant A | 0.2 g |
| Distilled water | 100 ml |
| pH adjusted to 5.6 with NaOH | |
| Preparation 6: Yellow Dye Solution 2 | |
| YD-2 | 40 g |
| Surfactant A | 0.2 g |
| pH 4 buffer | 200 ml |

The quaternized imidazole mordants set forth in Table II were tested in the same manner using the PVA/mordant resist formulation (2/1) of preparation 1 (Example 1).

TABLE II

Mordants of Formula I above wherein A = styrene, $R^1$ = H and $X^-$ = $Cl^-$

| Example | Q | x | y | z |
|---|---|---|---|---|
| 2 | $-CH_2CH_2OH$ | 50 | 25 | 25 |
| 3 | $-CH_2CH_2OH$ | 21 | 56 | 23 |
| 4 | $-CH_2CH_2OH$ | 48 | 4 | 48 |
| 5 | $-CH_2CH_2OH$ | 47 | 38 | 15 |
| 6 | —C6H4—CH3 | 57 | 19 | 24 |
| 7 | $-CH_2CH_2OH$ | 44 | 35 | 21 |

TABLE II-continued

Mordants of Formula I above wherein A = styrene, $R^1$ = H and $X^-$ = $Cl^-$

| Example | Q | x | y | z |
|---|---|---|---|---|
| 8 | ⟨benzyl⟩—CH₃ | 48 | 16 | 36 |
| 9 | ⟨benzyl⟩—CH₃ | 48 | 4 | 48 |
| 10 | —CH₂CH₂OH | 55 | 37 | 9 |
| 11 | —CH₂CH₂OH | 47 | 38 | 15 |
| 12 | —CH₂CH₂OH | 40 | 39 | 21 |
| 13 | —CH₂CH₂OH | 52 | 5 | 43 |
| 14 | —CH₂CH₂OH | 21 | 56 | 23 |
| 15 | —CH₂CH₂OH | 50 | 25 | 25 |
| 16 | —CH₂CH₂OH | 37 | 53 | 10 |
| 17 | —CH₂CH₂OH | 40 | 42 | 18 |
| 18 | —CH₂CH₂OH | 40 | 26 | 34 |
| 19 | —CH₂CH₂OH | 50 | 41 | 9 |
| 20 | ⟨benzyl⟩—CH₃ | 38 | 52 | 10 |
| 21 | —CH₂CH₂OH | 38 | 52 | 10 |
| 22 | ⟨benzyl⟩—CH₃ | 38 | 52 | 10 |
| 23 | —CH₂CH₂OH | 52 | 31 | 17 |
| 24 | ⟨benzyl⟩—CH₃ | 52 | 38 | 10 |
| 25 | —CH₂CH₂OH | 51 | 25 | 25 |
| 26 | —CH₂CH₂OH | 53 | 36 | 11 |
| 27 | —CH₂CH₂OH | 55 | 33 | 12 |
| 28 | —CH₂CH₂OH | 55 | 28 | 17 |
| 29 | —CH₂CH₂OH | 53 | 23 | 24 |
| 30 | —CH₂CH₂OH | 53 | 23 | 24 |
| 31 | —CH₂CH₂OH | 53 | 36 | 14 |
| 32 | —CH₂CH₂OH | 56 | 31 | 13 |
| 33 | —CH₂CH₂OH | 55 | 33 | 12 |
| 34 | —CH₂CH₂OH | 55 | 26 | 19 |
| 35 | —CH₂CH₂OH | 57 | 32 | 11 |
| 36 | —CH₂CH₂OH | 57 | 27 | 16 |
| 37 | —CH₂CH₂OH | 55 | 31 | 14 |
| 38 | —CH₂CH₂OH | 51 | 32 | 17 |
| 39 | —CH₂CH₂OH | 58 | 22 | 20 |
| 40 | —CH₂CH₂OH | 55 | 29 | 16 |
| 41 | —CH₂CH₂OH | 53 | 31 | 16 |
| 42 | —CH₂CH₂OH | 55 | 32 | 13 |
| 43 | —CH₂CH₂OH | 57 | 30 | 13 |
| 44 | —CH₂CH₂OH | 25 | 65 | 10 |
| 45 | —CH₂CH₂OH | 50 | 41 | 9 |

Testing was initially carried out using the cyan dye bath, which was experimentally determined to produce the most swelling of the resist layer. The resist was spin coated at 3000 and 6000 rpm onto a pair of two inch square clean glass plates. The plate were uniformly exposing for 12 seconds duration to 100 mw/cm² from a Tamarack Hg-Xe arc lamp, washed in flowing deionized water for 45 B seconds to remove excess unused dichromate and dyed for 4 minutes in the cyan dye bath at room temperature. Both plates were rinsed for 6 seconds, spun dry and baked 2 minutes at 130° C. The density per unit thickness (D/μm) was determined using a spectrophotometer to measure optical density (at 640 nm) and known thickness measuring techniques. Dyed thickness was determined for a number of control samples and plotted as a function of spin speed on a log-log plot. This yielded a straight line having a slope of −0.8. From this plot prepared in advance and the D/μμm value determined as described above a spin speed that will produce a layer that will dye to a density of 2.0 aim at 640 nm was determined and employed. All mordants were compared in this manner using a thickness necessary to produce a density of 2.0 with the cyan dye. Swelling and resolution were determined by known techniques.

Examples 1–45 produced generally acceptable results in terms of speed, resolution, dye density, adhesion and swelling. The mordant of Example 44 was incompatible with the dichromated PVA, producing an undesirable precipitate, presumably due to the relatively high ratio of y to z units. The best results were achieved in Examples 2, 3, 23, 34, 37 and 40.

This entire procedure was repeated except that the cyan dye solution of preparation 2 was replaced with the magenta and yellow dye solutions of preparations 3-6. The cyan and yellow dyes were at or near saturation after several minutes dyeing time. Only MD-2 lacked full saturation. However, some MD-2 may have been lost during rinse because of its high solubility in water.

The resist formulations of this invention exhibited excellent coating rheology resulting in smooth coated layers which produced uniform dye density. The dyed resists exhibited excellent thermal and light stability due to the influence of the PVA binder. Moreover, the resist exhibited excellent speed and significantly less yellow brown color and blue light absorption compared to a dichromated gelatin layer before and after exposure.

The invention has been described in detail with particular reference to preferred embodiments thereof, but it will be understood that variations and modifications can be affected within the spirit and scope of the invention.

What is claimed is:

1. A negative-working dyeable photoresist composition comprising in admixture
   (a) a poly(vinyl alcohol) binder,
   (b) a radiation-sensitive dichromate, and
   (c) a polymeric mordant comprising recurring units derived from a quaternized N-vinylimidazole
   wherein said polymeric mordant contains recurring units:

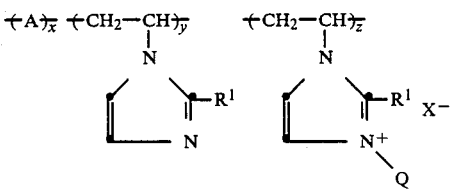

wherein:
A is a unit derived from an ethylenically unsaturated monomer;
each $R^1$ is independently H or methyl;

Q is alkyl or aryl;

X— is an acid anion;

x is 0 to 65 mole percent;

y is 0 to 65 mole percent; and z is 5 to 50 mole percent.

2. The resist of claim 1 wherein A is derived from styrene.

3. The resist of claim 2 wherein each $R^1$ is H, and Q represents benzyl or hydroxyethyl.

4. A method of producing a dyed negative-working image in a light-sensitive resist composition, comprising the steps of (1) imagewise exposing to activating radiation a position comprising in admixture (a) a poly(vinyl alcohol) binder, (b) a radiation-sensitive dichromate, and (c) a polymeric mordant comprising recurring units derived from a quaternized N-vinylimidazole wherein said polymeric mordant contains recurring units:

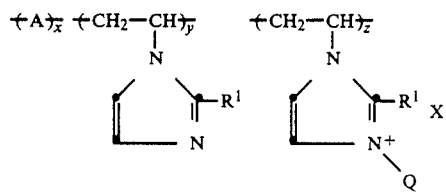

wherein:

A is a unit derived from an ethylenically unsaturated monomer;

each $R^1$ is independently H or methyl;

Q is alkyl or aryl;

X— is an acid anion;

x is 0 to 65 mole percent;

y is 0 to 65 mole percent; and z is 5 to 50 mole percent, (2) developing said exposed composition so that only the exposed areas remain, and (3) contacting said developed resist with at least one dye.

* * * * *